United States Patent [19]

Thomas et al.

[11] Patent Number: 5,195,729
[45] Date of Patent: Mar. 23, 1993

[54] WAFER CARRIER

[75] Inventors: Michael E. Thomas, Milpitas; Satoshi Sekigahama, Fremont; Richard von Salza Brown, San Jose, all of Calif.

[73] Assignee: National Semiconductor Corporation, Santa Clara, Calif.

[21] Appl. No.: 702,632

[22] Filed: May 17, 1991

[51] Int. Cl.⁵ .............................................. B23P 17/00
[52] U.S. Cl. .................................. 269/21; 269/289 R
[58] Field of Search ...................... 296/449, 309–313; 248/451, 223.4, 224.1, 224.2, 346.1, 310, 346, 500; 269/21, 289 R, 287, 303

[56] References Cited

U.S. PATENT DOCUMENTS

| | | | |
|---|---|---|---|
| 2,893,163 | 7/1959 | Hazel | 248/346.1 |
| 2,929,601 | 3/1960 | Anderson | 248/346 |
| 2,963,256 | 12/1960 | Borah | 248/346.1 |
| 3,393,892 | 7/1968 | Buck | 248/346.1 |
| 4,436,356 | 3/1984 | Stelling | 269/289 R |
| 4,644,639 | 2/1987 | Atteberry | 269/289 R |
| 4,744,550 | 5/1988 | Oglesbee | 269/21 |
| 4,970,772 | 11/1990 | Steere | 269/287 |
| 4,993,895 | 2/1991 | Nordstrom | 269/289 R |

Primary Examiner—Robert C. Watson
Attorney, Agent, or Firm—Irving S. Rappaport; Stephen R. Robinson; William H. Murray

[57] ABSTRACT

A carrier for a semiconductor wafer or other substrate has an outer portion adapted for engagement by equipment for processing wafers. Interior to the outer portion a substantially planar supporting surface is provided. A retaining lip is provided above the plane in which the supporting surface lies by at least the height of a wafer of a selected size. The circumference of the retaining lip is of sufficient size and proper shape to permit the passage of a wafer of the selected size. The carrier is undercut under the lip, whereby a wafer of the selected size, when placed on the supporting surface, may be retained.

In one embodiment, the carrier has a cylindrical shape. The top of the carrier includes a flat outer ring-like surface. The supporting surface and the circumference of the retaining lip are both circular.

18 Claims, 8 Drawing Sheets fig 1 fig 2

_FIG_ 3

_FIG_ 4

_FIG 12_

_FIG 13_

_Fig 14_

_Fig 15_

_fig 16_

_fig 17_

WAFER CARRIER

BACKGROUND OF THE INVENTION

This invention relates to apparatus for use in the fabrication of semiconductor devices and more particularly to carriers for wafers or other substrates for use in production of integrated circuits.

A wafer is typically a substantially cylindrical piece of silicon, the height of which is very small in proportion to its diameter. Such a wafer normally goes through a large number of processing steps until a number of integrated circuits have been fabricated on the wafer. These processing steps require handling of the wafer by a number of different machines.

In the manufacture of various types of integrated circuits, it is at times desirable to use more than one size of wafer. Six inch diameter and four inch diameter wafers are among those most commonly used, although a variety of sizes are possible. In order to change from one size to another, the equipment for handling the wafers must be adjusted or retooled. Such adjustment or retooling results in expense as well as periods of time when the equipment is out of use. Clips can be provided on processing equipment to secure wafers. However, such clips cover a fairly large area of the top surface of the wafer. Imperfections or particles on the clips can cause scratches on the wafer.

Alternatively, separate processing facilities must be provided for different sizes of wafers. This alternative is also expensive.

Objects and advantages of this invention will be evident from the detailed description of a preferred embodiment which follows.

SUMMARY OF THE INVENTION

A carrier for a substrate, for example a semiconductor wafer, includes an outer portion adapted for engagement by equipment for processing wafers. Interior to the outer portion, there is provided a substantially planar supporting surface on which a substrate may be supported. A retaining lip is provided above the plane in which the supporting surface lies by at least the height of a wafer of a selected size. The circumference of the retaining lip is of sufficient size and proper shape to permit the passage of a wafer of the selected size. The carrier is undercut under the retaining lip, whereby a wafer of the selected size placed on the supporting surface will be retained.

DETAILED DESCRIPTION OF A PREFERRED EMBODIMENT

Figure 1:
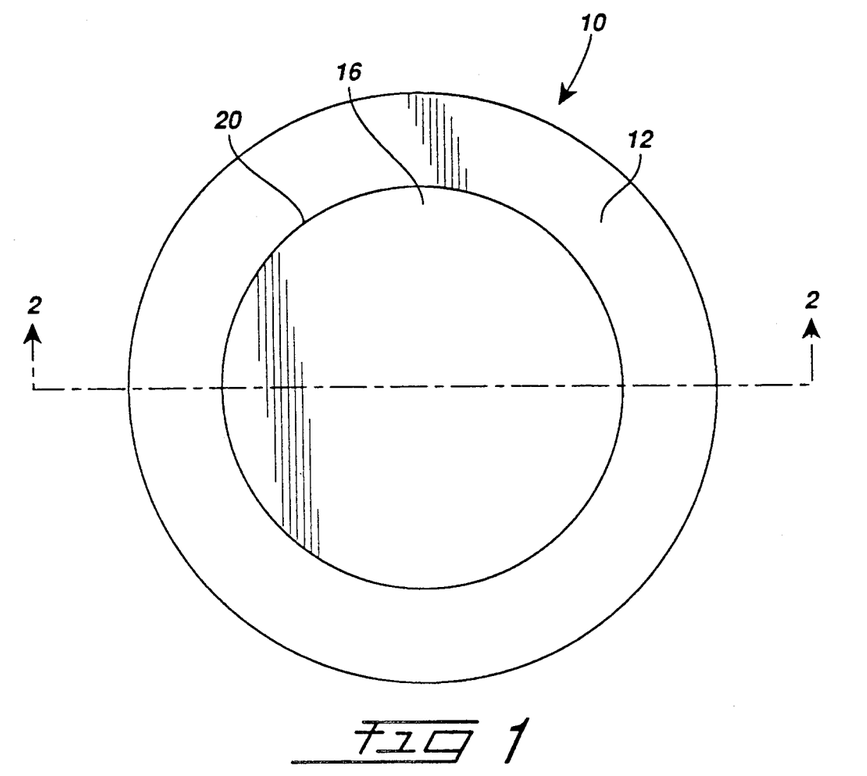
FIG. 1 is a top view of wafer carrier according to the invention.
Figure 2:
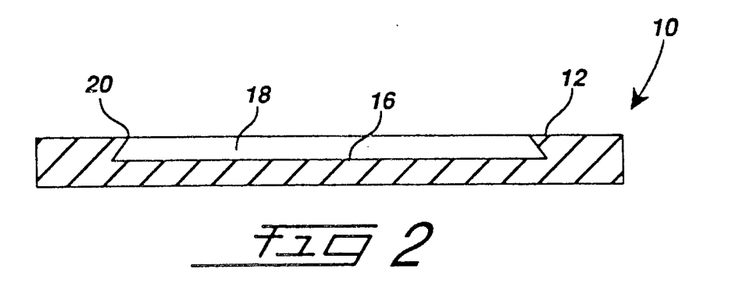
FIG. 2 is an enlarged sectional view, taken along line 2—2 of FIG. 1, of a wafer carrier according to the invention.

With reference to FIGS. 1 and 2, there is shown a preferred embodiment of a wafer carrier 10 according to the invention. Wafer carrier 10 is substantially in the form of a circular cylinder. The diameter of wafer carrier 10 is much greater than its height.

An annular surface 12 forms a portion of the top of wafer carrier 10. This annular surface 12 will be referred to as the outer top surface. The "outer portion" of the wafer carrier includes the perimeter and outer top surface 12.

In FIG. 1, outer top surface 12 is substantially planar. A retaining lip 20, along the interior edge of the outer top surface 12, has a substantially circular circumference. The carrier is undercut under the lip 20. The term "undercut," as used in this application, refers to providing an open space under a lip. As shown in FIG. 2, a surface 18 which has substantially the form of a portion of a cone not including an apex, or frusto-conical form, is provided where the carrier is undercut. The retaining lip 20 is also the upper edge of surface 18. Surface 18 will be referred to as a "retaining surface."

A substantially planar surface 16 is provided interior to outer top surface 12. The surface 16 will be referred to as the "supporting surface." Supporting surface 16 is lower than the outer top surface 12. Supporting surface 16 is substantially parallel to outer top surface 12. The perimeter of supporting surface 16 coincides with a wider, lower end of retaining surface 18. The perimeter of supporting surface 16 is greater than the circumference of retaining lip 20.

Figure 3:
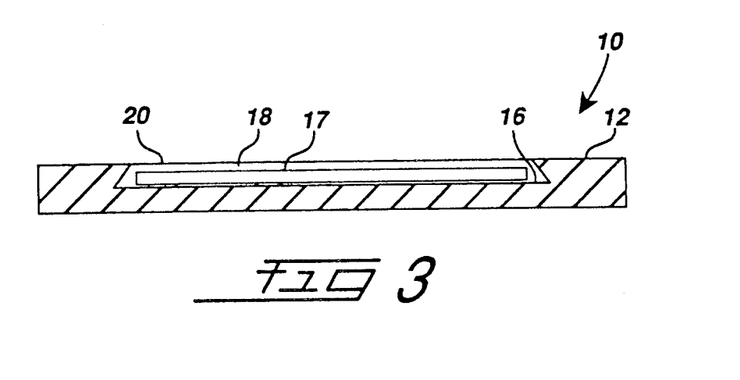
FIG. 3 is an enlarged sectional view, taken along line 2—2 of FIG. 1, of a wafer carrier according to the embodiment of FIG. 1 showing placement of a wafer.

FIG. 3 shows the placement of a wafer 17 in a carrier 10. Wafer 17 rests on supporting surface 16.

The dimensions of certain features of wafer carrier 10 are defined with respect to the dimensions of the wafer which the carrier is designed to hold. The height of lip 20, and at least an inner portion of retaining surface 18, above the supporting surface 16 must be at least slightly greater than the height of the wafer 17. The circumference of lip 20 must be of sufficient size and proper shape that a wafer may pass through the opening defined by lip 20. In the embodiment of FIGS. 1, 2, and 3, the circumference of lip 20 must be greater than the diameter of the wafer 17. Thus, a wafer may be placed through the aperture defined by lip 20 on supporting surface 16.

Figure 4:
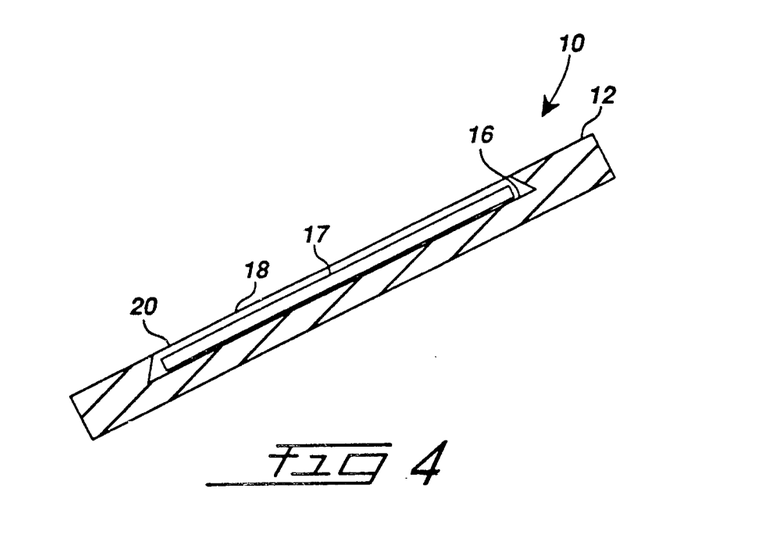
FIG. 4 is a sectional view of a wafer carrier according to the invention showing placement of a wafer and rotation of the carrier with respect to a horizontal orientation.

When the wafer carrier is rotated about an axis lying in or parallel to the plane of outer top surface 12, the wafer 17 may begin to slide transversely across supporting surface 16. The wafer will stop sliding when a leading edge of the wafer contacts a portion of retaining surface 18. The wafer 17 then rests against retaining surface 18. This is shown in FIG. 4. The retaining surface 18 thus functions as a transverse supporting member, which stops the transverse motion of the wafer. As the carrier is rotated further, the wafer 17 remains in place, resting against retaining surface 18 as shown in cross-section in FIG. 4.

When the carrier is rotated more than 90 degrees, wafer 17 exerts an upward force against interior surface 18. Because retaining surface 18 extends over a portion of wafer 17, wafer 17 will not fall out of the carrier. It will be seen that the frusto-conical retaining surface 18 shown in the embodiment of FIGS. 1 through 4 has both the function of providing transverse support so that the wafer stops sliding, and the function of providing retention of the wafer. The combination of lip 20 and an undercut in the carrier under lip 20 functions to retain a wafer when the carrier is rotated. Depending on the design of the carrier, the carrier may be rotated almost 180 degrees without causing the wafer to fall out. Only a very small portion of the upper surface of the wafer comes in contact with the carrier. As a result, the possibility of the wafer being scratched is minimized.

The outer diameter of the wafer carrier 10 is preferably the same as that of a commonly-used size of wafer. The outer diameter of wafer carrier 10 is preferably the same as the outer diameter of the largest wafer that the processing equipment will accommodate.

Figure 5:
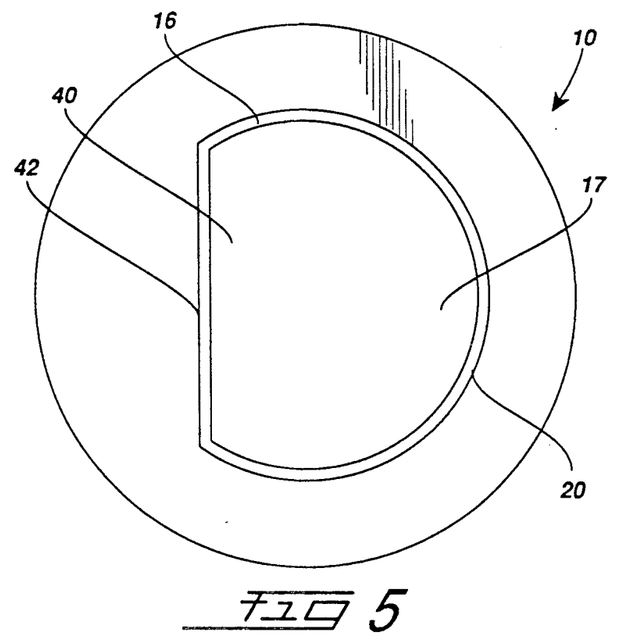
FIG. 5 is a top view of a wafer carrier according to an alternate embodiment of the invention showing placement of a wafer.

The form of the features of wafer carrier 10 is also defined with respect to the form of the wafer which the carrier is designed to hold. The shape of the circumference of lip 20 is preferably the same as the shape of the perimeter of the wafer. The shape of supporting surface 16 is preferably the same as the shape of the perimeter of the wafer. FIG. 5 illustrates the foregoing. A top view of a wafer carrier 10 is shown. Wafer 17, viewed from the top, has a circular perimeter, except for a flat side 40. It is typical for a wafer to have at least one such flat side, called the major flat. Retaining lip 20 of wafer carrier 10 is correspondingly circular when viewed from the top, except for a flat side 42 corresponding to flat side 40 of the wafer. Supporting surface 16 has the same shape as lip 20.

Wafer carrier 10 is preferably designed for mating with the appropriate equipment. The design of a wafer of the same diameter as the wafer carrier may include features that facilitate engagement of the wafer by processing equipment. Such features might facilitate gripping of the wafer or proper orientation of the wafer in processing equipment.

Figure 6:
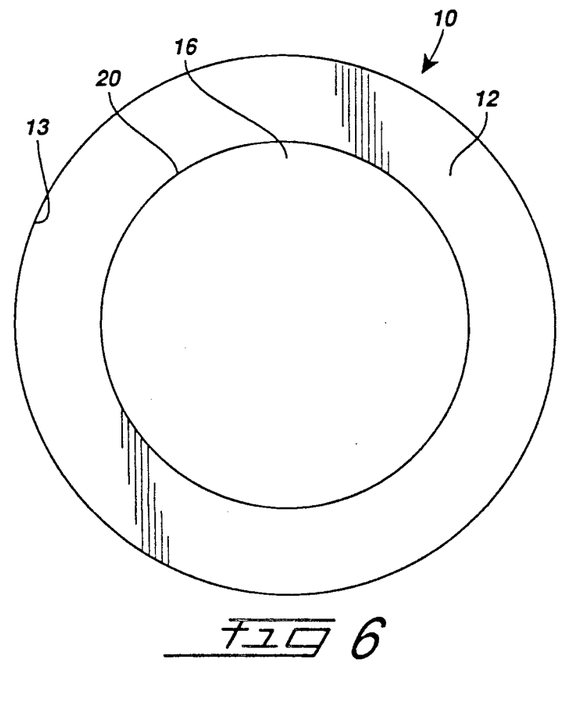
FIG. 6 is a top view of a wafer carrier according to another alternate embodiment of the invention.

Features that facilitate gripping of the wafer or orientation of the wafer carrier may include, for example, a perimeter that is non-circular, or optical marks. By way of further example, the wafer carrier may include optical orientation marks on outer top surface 12, for orientation of the wafer carrier. This is illustrated in FIG. 6. An optical mark 13, specifically a straight line extending radially inward from the perimeter of wafer carrier 10, is provided on outer top surface 12. Mark 13 facilities orientation of the wafer carrier 10.

Ordinarily, the wafer of the largest diameter will be substantially circular. If so, then the wafer carrier 10 may be cylindrical, as shown in FIGS. 1, 2, 3 and 4.

By way of example, and not limitation, a wafer carrier according to the invention may be provided having the following dimensions. The outer diameter is six inches, the diameter of the largest wafer which can be accommodated by the processing equipment. It is desired to process a smaller wafer having a diameter of four inches. The height of the carrier is approximately 0.15 centimeters. The height of lip 20 above supporting surface 16 is approximately 0.075 centimeters. The diameter of the circumference of lip 20 is approximately 10.5 centimeters. The diameter of supporting surface 16 is approximately 11.0 centimeters.

Figure 7:
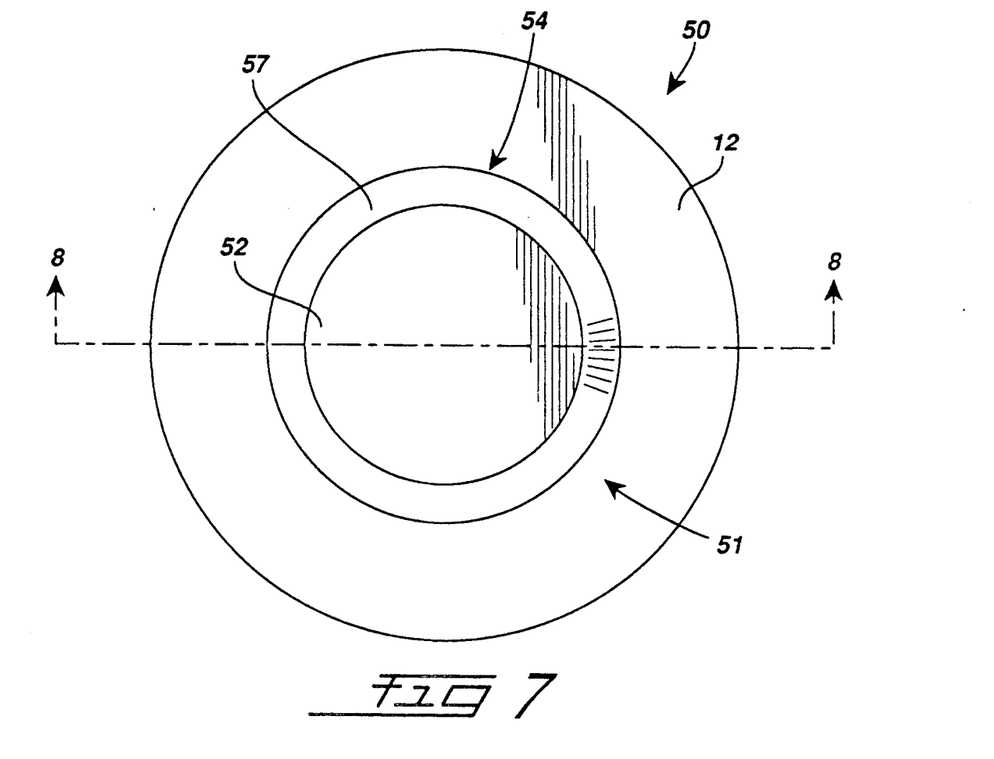
FIG. 7 is a top view of a wafer carrier according to another alternate embodiment of the invention.
Figure 8:
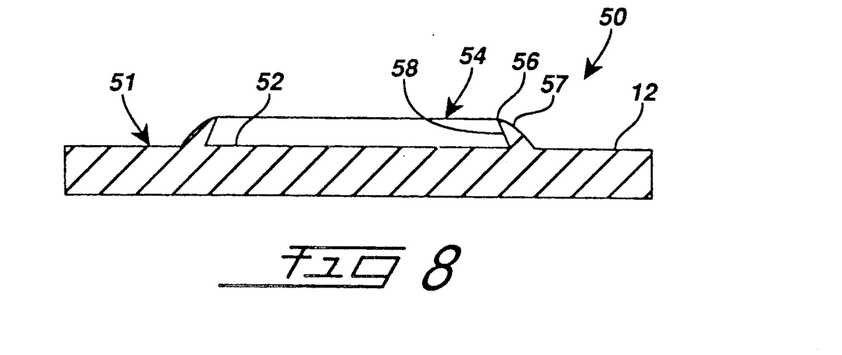
FIG. 8 is an enlarged sectional view, taken along line 8—8 of FIG. 7, of a wafer carrier according to the embodiment of FIG. 7.

In the embodiments of a wafer carrier according to the invention shown in FIG. 1, 2, 3, 4, 5 and 6, outer top surface 12 and retaining surface 18 intersect to define a lip 20. There may be provided a wafer carrier according to the invention where a surface other than an outer top surface intersects a retaining surface to define retaining lip, for example the carrier 50 depicted in FIG. 7 and 8. Wafer carrier 50 is a substantially a circular cylinder. The diameter of wafer carrier 50 is much greater than its height. Wafer carrier 50 has a circular planar top surface 51. Annular member 54 projects upward from the top surface of wafer carrier 50. Annular member 54 is concentric with carrier 50. The portion of the top surface of carrier 50 exterior to annular member 54 is outer top surface 12. As in the embodiment of FIG. 1, the outer top surface 12 is planar and annular. The portion of the top surface of carrier 50 interior to annular member 54 is supporting surface 52. Supporting surface 52 lies in a plane. Annular member 54 has an outer surface 57 and an inner surface 58. A retaining lip 56 depends inward from annular member 54. Lip 56 is defined by the intersection of outer surface 57 and inner surface 58 of annular member 54. Annular member 54 is undercut on its interior below lip 56. The circumference of the perimeter of supporting surface 52 is consequently greater than the circumference of lip 56. Inner surface 58 of annular member 54 has substantially the form of a portion of a cone. The dimensions and shape of the features of carrier 50 are defined with reference to the dimensions and shape of a wafer to be used with the carrier. The height of lip 56 above supporting surface 52 is at least slightly greater than the height of the wafer. The shape of the circumference of lip 56 is preferably the same as the shape of the perimeter of the wafer viewed from the top. The shape of supporting surface 52 is desirably the same as the shape of the perimeter of the wafer. In the same manner as explained above in connection with the embodiment of FIG. 1, the carrier 50 may be rotated about an axis lying in the plane of the carrier or parallel thereto without causing a wafer placed on supporting surface 52 to fall out.

Figure 9:
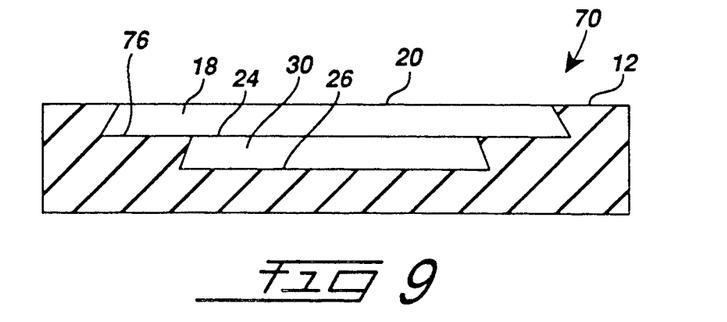
FIG. 9 is a top view of a wafer carrier according to yet another alternate embodiment of the invention.
Figure 10:
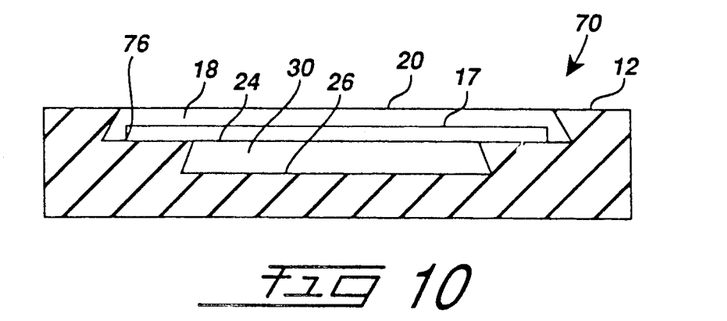
FIG. 10 is an enlarged sectional view, taken along line 10—10 of FIG. 9, of a wafer carrier according to the embodiment of FIG. 9, showing placement of a wafer.
Figure 11:
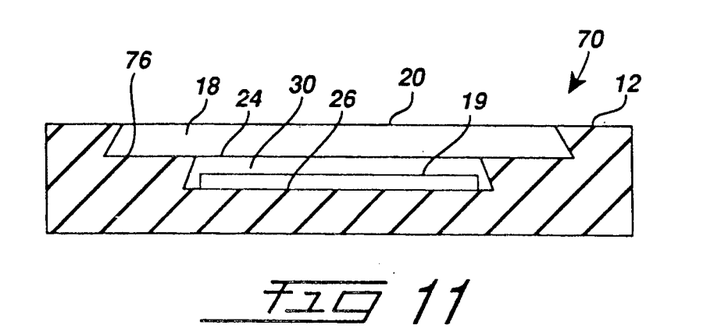
FIG. 11 is an enlarged sectional view, taken along line 10—10 of FIG. 9, of a wafer carrier according to the embodiment of FIG. 9, showing alternate placement of a wafer.

Another alternate preferred embodiment of a carrier according to the invention is shown in FIGS. 9, 10 and 11. The carrier of this embodiment is configured to accommodate wafers of two different sizes. Wafer carrier 70 is shown in cross-section. Carrier 70 is substantially a circular cylinder. Outer top surface 12 is substantially as shown and described in the embodiment of FIG. 1. Outer top surface 12 is a substantially planar annular surface. A first retaining lip 20 of the carrier is coextensive with an inner edge of outer top surface 12. The carrier is undercut under first lip 20. A retaining surface 18, having substantially the form of a portion of a cone, extends downward and outward from first lip 20. Retaining surface 18 is as described in FIGS. 1 and 2. The lower, wider edge of retaining surface 18 coincides with a perimeter of a first supporting surface 76. First supporting surface 76 is substantially annular and planar. A second retaining lip 24 is provided at the interior edge of first supporting surface 76. The carrier is undercut beneath the second lip 24. A second retaining surface 30, which has substantially the form of a portion of a cone, is provided extending downward and outward from second lip 24. A lower, wider edge of second retaining surface 30 coincides with an outer perimeter of a second supporting surface 26. Second supporting surface 26 is substantially planar and circular.

As shown in FIG. 10, a wafer 17, of a first selected size, may be placed on first supporting surface 76. As shown in FIG. 11, alternatively, a wafer 19, of a second selected size, may be placed on second supporting surface 26. The size of wafer 17 is larger than the size of wafer 19. The dimensions and shape of carrier 70 are defined with reference to the dimensions and shape, or shapes, of wafers to be used with the carrier. The height of second lip 24 above second supporting surface 26 is at least slightly greater than the height of wafer 19. The shape and size of the circumference of lip 24 are selected so that wafer 19 may pass through the opening defined by lip 24. The shape of the circumference of lip 24 is preferably the same as the shape of the perimeter of wafer 19. The shape of the perimeter of second supporting surface 26 is preferably the same as the shape of the perimeter of wafer 19. First supporting surface 76 is sufficiently thick from interior edge to exterior edge that, when a wafer 17 of a first size rests against first retaining surface 18, wafer 17 will remain flat, supported on first supporting surface 76.

Additional planar annular supporting surfaces, similar to first supporting surface 76, may be provided. Each such annular supporting surface, on its outer edge, intersects a lower, wider edge of a retaining surface having substantially the form of a portion of a cone. Each supporting surface is sufficiently thick that a wafer of the proper diameter may rest thereon. The number of such supporting surfaces is limited by the height of the wafer carrier. The height differential between two supporting surfaces is at least slightly greater than the thickness of a wafer that is to be placed on the lower of the two supporting surfaces.

Figure 12:
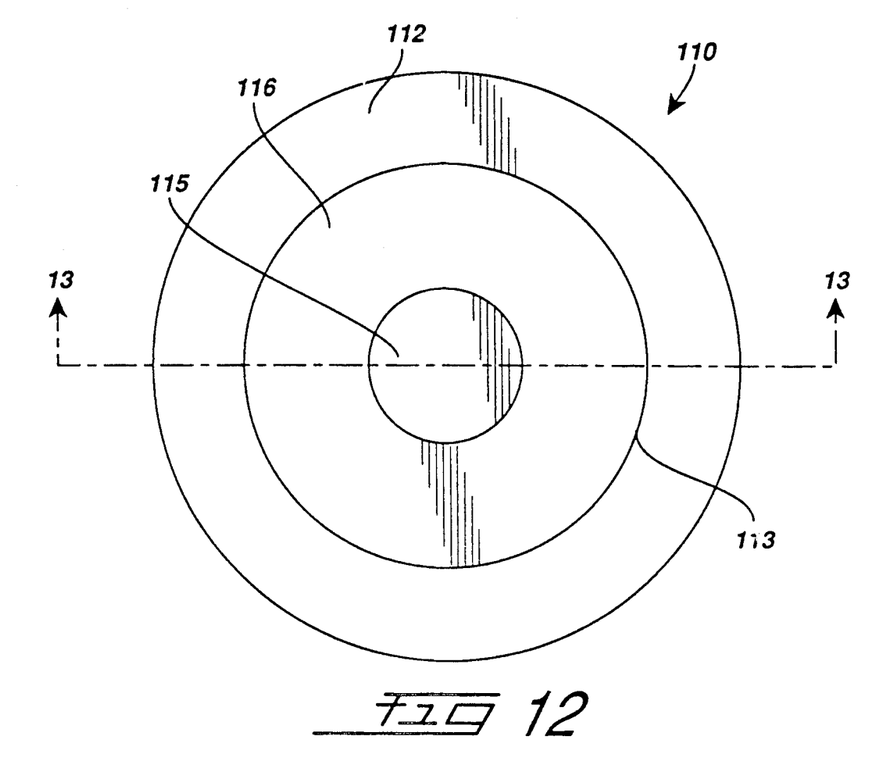
FIG. 12 is a top view of a wafer carrier according to still another alternate embodiment of the invention.
Figure 13:
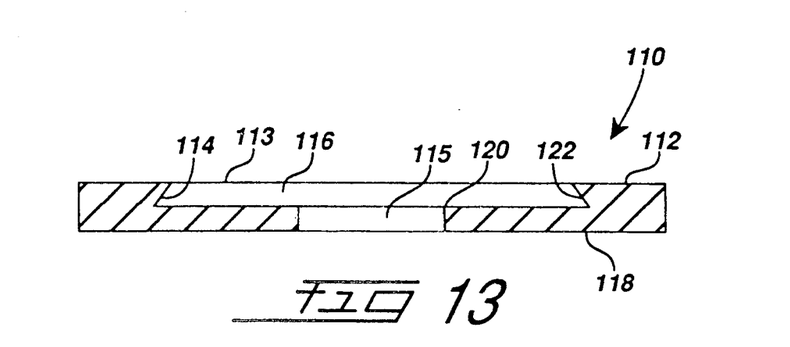
FIG. 13 is an enlarged sectional view, taken along line 13—13 of FIG. 12, of a wafer carrier according to the embodiment of FIG. 12.

FIGS. 12 and 13 depict a carrier for a semiconductor wafer in accordance with yet another alternate preferred embodiment of the invention. A carrier 110 is shown. Carrier 110 has a substantially cylindrical outline. An outer top surface 112 is a planar, annular surface. A bottom surface 118 is planar and annular. An interior edge of top surface 112 is a retaining lip 113. Carrier 110 is undercut under lip 113 so as to provide a retaining surface 114 (see FIG. 13) having substantially the form of a portion of a cone. Lip 113 coincides with an upper, narrower edge of frusto-conical retaining surface 114. A lower, wider edge of retaining surface 114 coincides with a perimeter of a supporting surface 116. Supporting surface 116 lies in a plane, and is annular. Annular supporting surface 116 is sufficiently thick, from interior edge 120 to exterior edge 122, that a wafer, of a selected size, supported by supporting surface 116, and in contact at one point with retaining surface 118, will be supported thereon. The interior edge of supporting surface 116 defines a perimeter of a central cylindrical aperture 115 in carrier 110. Aperture 115 has a top opening in supporting surface 116. Carrier 110 thus has an overall annular shape. This annular shape is advantageous if the carrier 110 is heated and cooled in use. The annular shape allows the carrier 110 to undergo thermal expansion and contraction with a minimum of distortion. It is preferable that the diameter of aperture 115 be a substantial portion of the diameter of the carrier. For example, the diameter of aperture 115 may be about one-half that of carrier 110.

Figure 14:
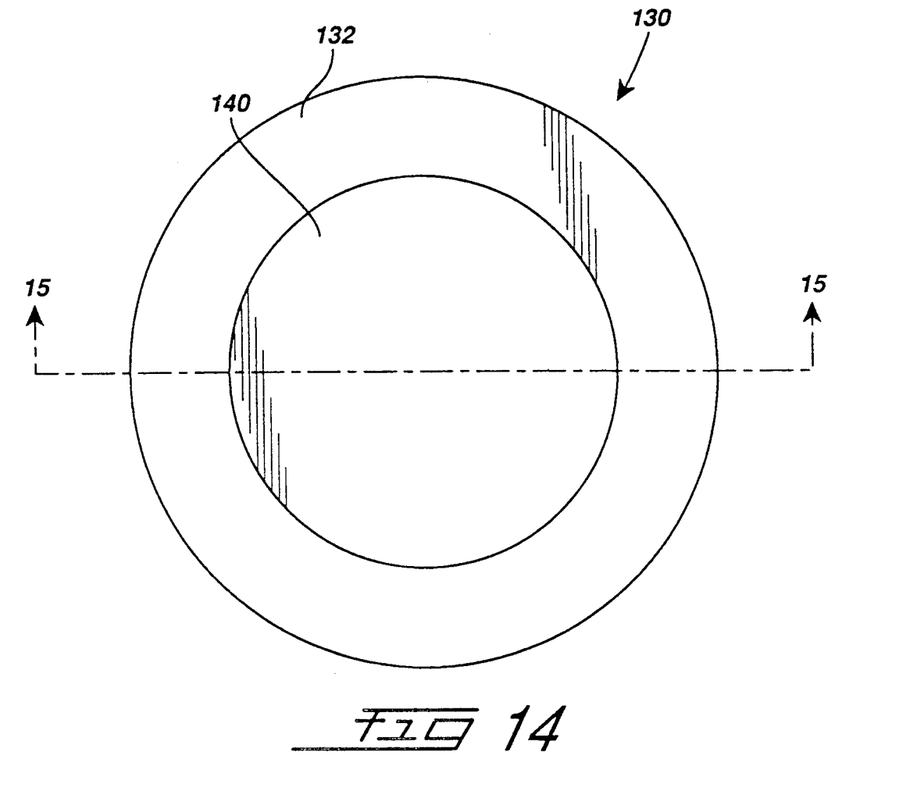
FIG. 14 is a top view of a wafer carrier according to another alternate embodiment of the invention.
Figure 15:
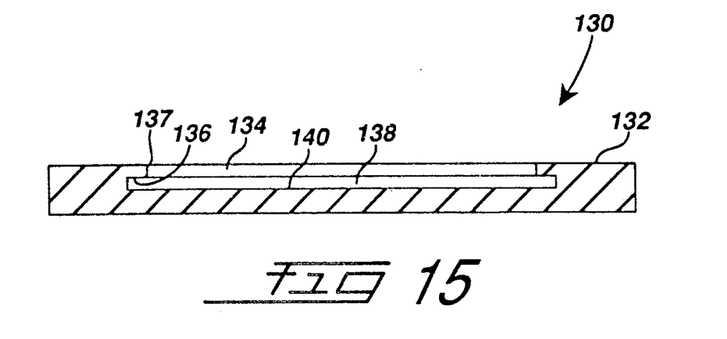
FIG. 15 is an enlarged sectional view, taken along line 15—15 of FIG. 14, of a wafer carrier according to the embodiment of FIG. 14.

FIGS. 14 and 15 depict a carrier for a semiconductor wafer according to still another alternate preferred embodiment of the invention. Carrier 130 is shown. Carrier 130 is substantially cylindrical. Outer top surface 132 of carrier 130 is planar and annular. The interior edge of outer top surface 132 coincides with a top edge of a cylindrical vertical interior surface 134. A bottom edge of cylindrical interior surface 134 coincides with an interior edge of an annular lower surface 136. Annular lower surface 136 is planar and parallel to outer top surface 132. An annular retaining lip 137 is thus defined by an inner portion of outer top surface 132, cylindrical interior surface 134, and annular lower surface 136. Carrier 130 is undercut below annular lip 137. An outer edge of annular lower surface 136 coincides with a top edge of a vertical cylindrical surface 138. A perimeter of a circular planar supporting surface 140 coincides with a bottom edge of vertical cylindrical surface 138. Supporting surface 140 is parallel to outer top surface 132 and lower surface 136. The vertical distance from lower surface 136 of lip 137 to supporting surface 140 must be at least slightly greater than the height of a wafer of a selected size.

A wafer of a selected size may be placed onto supporting surface 140. It will be seen that the diameter of a cylinder defined by cylindrical interior surface 134 must be greater than the diameter of a wafer of a selected size. When carrier 130 is rotated about an axis parallel to outer top surface 132, the wafer will slide transversely across supporting surface 140. A leading edge of the wafer will slide under lip 137. When the leading edge of the wafer comes in contact with vertical cylindrical surface 138, the wafer stops sliding transversely. Thus vertical cylindrical surface 138 functions to provide transverse support. When the rotation reaches 90 degrees from horizontal, the wafer will begin to move toward the top of the carrier. A portion of the wafer will come in contact with the lower surface 136 of lip 137. The movement of the wafer will then stop. Thus lip 137 serves to retain the wafer.

It will be seen that the carrier 130 is undercut, as is the carrier 10 shown and described in the embodiment of FIG. 2. However, the retaining surface 18 shown and described in the embodiment of FIG. 2, has the functions of both vertical cylindrical surface 138 and lower surface 136 of lip 137 in the embodiment of FIGS. 14 and 15. Retaining surface 18, in the embodiment of FIG. 2, provides transverse support so that the wafer stops sliding when rotation of the carrier begins. Retaining surface 18 also provides retention of the wafer when rotation of the carrier exceeds 90 degrees.

Figure 16:
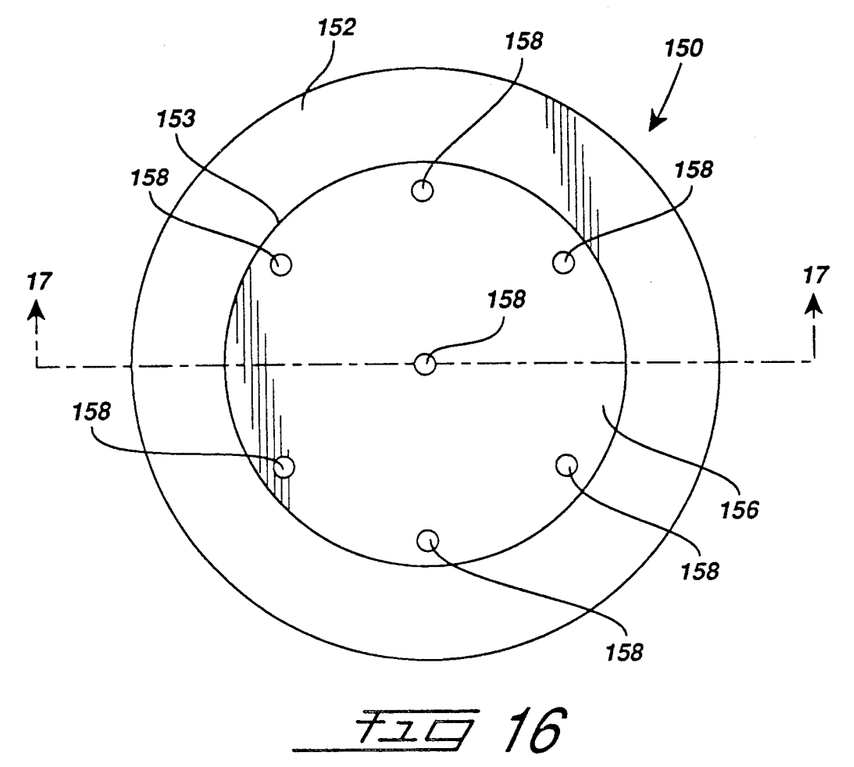
FIG. 16 is a top view of a wafer carrier according to another alternate embodiment of the invention.
Figure 17:
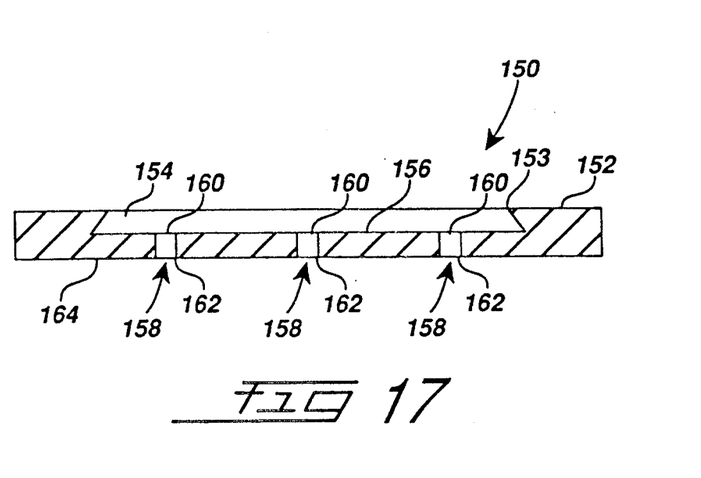
FIG. 17 is an enlarged sectional view, taken along line 17—17 of FIG. 16, of a wafer carrier according to the embodiment of FIG. 16.

FIGS. 16 and 17 show a carrier for a semiconductor wafer according to another alternate preferred embodiment of the invention. Carrier 150 is depicted. Carrier 150 has a generally cylindrical outline. An outer top surface 152, on the top of carrier 150, is substantially planar and annular. A bottom surface 164 of the carrier is substantially planar and circular, and substantially parallel to outer top surface 152. The interior edge of outer top surface 152 is a retaining lip 153. Carrier 150 is undercut below lip 153. A substantially frusto-conical retaining surface 154 extends downward and outward from lip 153. A substantially circular supporting surface 156 is provided. Supporting surface 153 is planar and is substantially parallel to outer top surface 152. The perimeter of supporting surface 156 coincides with a lower, wider edge of retaining surface 154. Substantially vertical cylindrical passageways 158 are provided. Each passageway 158 has an upper opening 160 in supporting surface 156 and a lower opening 162. Lower openings 162 open to the exterior of the carrier, specifically in the bottom surface 164 of the carrier. If a vacuum or partial vacuum is created at bottom surface 164, a wafer in place in carrier 150 will be pulled down on supporting surface 156. FIG. 16 illustrates seven passageways 158 merely for convenience of illustration. It may be desirable to provide more or fewer passageways.

A wafer carrier according to the invention may be made of any suitable material. The material will be selected depending upon the conditions under which the carrier is used. For example, for low-temperature applications, aluminum can be used. In high-temperature application, a coated carbon material is preferable. A wafer carrier according to the invention may also be made of fused quartz.

It will be appreciated that there are considerable variations that can be accomplished in an article of the invention without departing from its scope. As a result, although a number of preferred embodiments of an article of the invention have been described above, it is emphasized that the invention is not limited to a preferred embodiment and there exist other alternative embodiments that are fully encompassed within the invention's scope, which is intended to be limited only by the scope of the appended claims.

What is claimed is:

1. A carrier for a substrate of a selected size comprising:
   (a) an outer portion adapted for engagement by equipment for processing wafers;
   (b) a substantially planar supporting surface, interior to said outer portion; and
   (c) a retaining lip above the plane in which said supporting surface lies by at least the height of a substrate of the selected size; the circumference of said retaining lip defining an opening in said carrier of sufficient size and proper shape to permit the passage of a substrate of said selected size;
   said carrier being undercut under said retaining lip sufficiently to cause a substrate of said selected size placed on said supporting surface to be retained, said carrier being rigid.

2. A carrier for a substrate as recited in claim 1, wherein said outer portion comprises a substantially planar and annular top surface.

3. A carrier for a substrate as recited in claim 1, wherein an outer perimeter of said carrier has substantially the same shape and dimensions as a substrate of a second selected size.

4. A carrier for a substrate as recited in claim 3, wherein said outer portion includes a planar, annular top surface.

5. A carrier for a substrate as recited in claim 4, wherein said top surface has an optical orientation mark provided thereon.

6. A carrier for a substrate as recited in claim 4, wherein said carrier is undercut under said lip so as to provide a substantially frusto-conical surface, an upper edge of which surface coincides with said lip and a lower edge of which coincides with a perimeter of said supporting surface.

7. A carrier for a substrate as recited in claim 6, wherein said carrier is substantially cylindrical.

8. A carrier for a substrate as recited in claim 1, further comprising an annular projection extending upward therefrom, said annular projection having an inner surface, wherein said supporting surface is interior to said annular projection, said retaining lip is provided on said inner surface of said annular projection and said annular projection is undercut under said retaining lip.

9. A carrier for a substrate as recited in claim 1, further comprising:
   (a) a second supporting surface, lying in a plane, interior to said supporting surface; and
   (b) a second retaining lip, coinciding with an interior edge of said supporting surface, the circumference of said second retaining lip defining an opening of sufficient size and proper shape to permit the passage of a substrate of a second selected size, and said second retaining lip being above said second supporting surface by at least the height of a substrate of said second selected size, said carrier being undercut beneath said second retaining lip, whereby a substrate of said second selected size placed on said second supporting surface will be retained; said supporting surface having an interior circumference sufficiently small that a substrate of said selected size will be supported on said supporting surface.

10. A carrier for a substrate as recited in claim 9, wherein said retaining lip is undercut so as to provide a substantially frusto-conical surface having a top edge coextensive with said retaining lip and a lower edge coextensive with a perimeter of said supporting surface, and said carrier being undercut under said second retaining lip so as to provide a substantially frusto-conical second surface having a top edge coextensive with said second retaining lip and a lower edge coextensive with a perimeter of said second supporting surface.

11. A carrier for a substrate as recited in claim 1, wherein said carrier has an aperture through a central portion thereof, said aperture having a top opening in said supporting surface and a bottom opening in a lower surface of said carrier.

12. A carrier for a substrate as recited in claim 11, Wherein said aperture comprises a cylindrical aperture having a top opening disposed substantially centrally in said supporting surface.

13. A carrier for a substrate as recited in claim 1, further comprising one or a plurality of passageways, each one of said passageways having a first opening in said supporting surface and a second opening exterior to said carrier.

14. A carrier for a substrate as recited in claim 13, wherein each of said passageways is vertical, and said second opening of each of said passageways is in a bottom surface of said carrier.

15. A carrier for a substrate as recited in claim 1, wherein a perimeter of said supporting surface has substantially the same shape as a substrate of said selected size.

16. A carrier for a substrate as recited in claim 15, wherein said retaining lip has substantially the same shape as a substrate of a selected size.

17. A carrier for a substrate as recited in claim 16, wherein said perimeter of said supporting surface and said retaining lip are substantially circular, except that each has a flat section.

18. A carrier for a substrate as recited in claim 1, wherein said retaining lip has substantially parallel planar upper and lower surfaces.

* * * * *